US006242804B1

United States Patent
Inoue

(10) Patent No.: US 6,242,804 B1
(45) Date of Patent: *Jun. 5, 2001

(54) FABRICATION PROCESS OF A SEMICONDUCTOR DEVICE HAVING A NITRIDE FILM

(75) Inventor: Tatsuya Inoue, Kasugai (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/845,888

(22) Filed: Apr. 28, 1997

(30) Foreign Application Priority Data

Oct. 24, 1996 (JP) .................................... 8-282211

(51) Int. Cl.⁷ ............................ H01L 23/48; H01L 23/52; H01L 29/40
(52) U.S. Cl. ............................ 257/751; 257/763; 257/764
(58) Field of Search ....................... 257/751, 764, 257/763, 767, 750

(56) References Cited

U.S. PATENT DOCUMENTS

| 4,887,146 | * | 12/1989 | Hinode ................................. 257/751 |
| 5,162,262 | * | 11/1992 | Ajika et al. . |
| 5,420,072 | * | 5/1995 | Fiordalice et al. . |
| 5,449,954 | * | 9/1995 | Ito ....................................... 257/764 |
| 5,514,908 | * | 5/1996 | Liao et al. ........................... 257/764 |
| 5,552,341 | * | 9/1996 | Lee ...................................... 257/751 |
| 5,561,326 | * | 10/1996 | Ito et al. ............................. 257/751 |
| 5,573,978 | * | 11/1996 | Cho ..................................... 438/643 |
| 5,597,745 | * | 1/1997 | Byun et al. ......................... 438/239 |
| 5,604,140 | * | 2/1997 | Byun . |
| 5,654,235 | * | 8/1997 | Matsumoto et al. ................ 438/643 |

FOREIGN PATENT DOCUMENTS

| 59-182208 | 10/1984 | (JP) . |
| 2-244622 | 9/1990 | (JP) . |
| 8-22967 | 1/1996 | (JP) . |

* cited by examiner

*Primary Examiner*—Olik Chaudhuri
*Assistant Examiner*—Phat X. Cao
(74) *Attorney, Agent, or Firm*—Arent Fox Kintner Plotkin & Kahn PLLC

(57) ABSTRACT

A method of forming a nitride film by a reactive sputtering process includes the steps of (A) sputtering a first nitride film on a substrate by using a target of a refractory metal element under a first sputtering condition set such that a deposition of a nitride of the refractory metal element occurs on the substrate as a result of the sputtering, and (B) sputtering, after the step (A), a second nitride film on the first nitride film by using the target used in the step (A) under a second sputtering condition, wherein the second sputtering condition is set such that no deposition of the nitride occurs on the first nitride film.

2 Claims, 12 Drawing Sheets

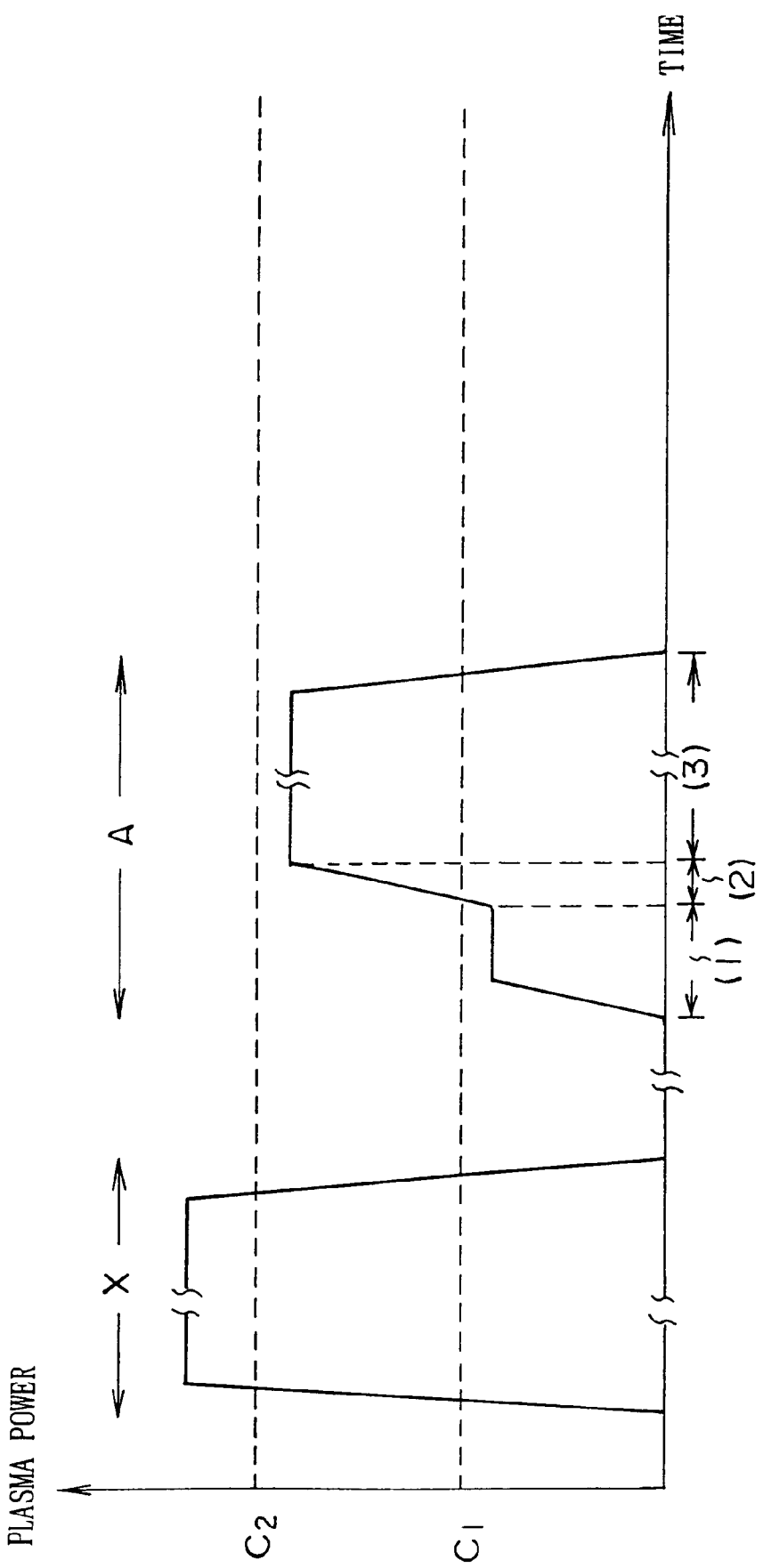

FABRICATION PROCESS OF A SEMICONDUCTOR DEVICE HAVING A NITRIDE FILM

BACKGROUND OF THE INVENTION

The present invention generally relates to semiconductor devices and more particularly to a fabrication process of a semiconductor device including a metallization process.

Metallization process is a process indispensable for fabricating a semiconductor device. For example, a metallization process is used when forming a conductor layer of Al or an Al-alloy on a substrate. Generally, a metallization process is carried out by a sputtering process.

When fabricating a Si semiconductor device, it is commonly practiced to form a diffusion barrier of TiW, TiC, TiN, and the like, between an interconnection pattern, which may be formed of Al or an Al-alloy, and a bonding region defined on a Si substrate, prior to the metallization process of a conductor layer from which various interconnection patterns are formed. Such diffusion barriers are used for preventing the formation of alloy spikes that otherwise would be formed as a result of diffusion of Al from the interconnection pattern into the Si substrate across a thin diffusion region formed on the Si substrate.

Generally, a TiN diffusion barrier is formed by a reactive sputtering process in which the sputtering of Ti is carried out in a nitrogen plasma environment while using a high purity Ti target. While it is possible to use a TiN target for the sputtering of a TiN film, use of a TiN target tends to cause a problem of excessive deposition thickness for the TiN film thus formed on the substrate. When the thickness of the TiN film is excessive, there appears a tendency that the TiN film comes off easily from the substrate. Because of this reason, a TiN target is not used in the formation of TiN diffusion barriers.

It should be noted that a diffusion barrier, being used in a contact region in which an interconnection pattern is connected electrically to a semiconductor device, is required to have a low resistance as low as possible, in addition to a dense film structure or texture, which is a requisite of an effective diffusion barrier.

A TiN film is also used for a glue layer of a W layer or an anti-reflection film of an Al interconnection pattern. When a TiN film is used for a glue layer of a W layer, it is desired that the TiN film experiences little corrosion when exposed to $WF_6$, which is generally used for a CVD gaseous source of a W layer. In order to meet for such a demand, the TiN film is again required to have a high density texture.

On the other hand, in the conventional reactive ion etching process that uses a Ti target, there has been a problem in that the condition in which a TiN film is formed stably and reproducibly with high density and/or low resistance is limited substantially. Thus, it has been difficult to form a high density, low resistance TiN film suitable for a diffusion barrier efficiently and hence with a high throughput of production.

When forming a TiN diffusion barrier by a sputtering process, it is generally practiced to carry out a dummy sputtering process first on a dummy substrate for cleaning the surface of the Ti target to be used for the sputtering, such that any impurities on the surface are removed during such a dummy sputtering process. However, the phenomenon of reactive sputtering is not fully understood yet, and there has been a problem in that the use of such a cleaned Ti target tends to narrow the range of the sputtering condition in which a satisfactory TiN film is obtained reliably and reproducibly.

More specifically, it is known that no TiN film is formed in a reactive sputtering process conducted in a plasma of a gas mixture of Ar and $N_2$, when the proportion of Ar in the gas mixture is large and the proportion of $N_2$ in the gas mixture is small. In this respect, it is known that a TiN film is readily obtained when the proportion of $N_2$ in the plasma gas mixture is increased. However, the TiN film thus obtained tends to show a low density texture and correspondingly high resistance not suitable for a diffusion barrier. Thus, the optimum condition for obtaining a TiN film suitable for a diffusion barrier is substantially limited with respect to the gas mixture composition, sputtering power, and the like.

It is well known that TiN forms a non-stoichiometric compound represented by $TiN_x$. Thus, a TiN film having a coarse and correspondingly low density texture is tend to be obtained when the $N_2$ proportion in the plasma gas mixture is large. The coarse TiN film thus formed generally includes coarse TiN crystals aligned in a <111>-direction. When the proportion of $N_2$ in the plasma gas mixture is reduced, on the other hand, a TiN film having a dense texture can be obtained. The dense TiN film thus formed generally includes fine and uniform TiN crystals aligned in a <200>-direction. The dense TiN film thus obtained has a further advantageous feature in that the surface of the TiN film is smooth and flat. However, reproducible or reliable formation of such a dense TiN film is substantially difficult, in view of the fact that the sputtering has to be conducted under a narrow condition in which the $N_2$ proportion is set small.

It is also known that a high density TiN film suitable for a diffusion barrier may be obtained by a plasma sputtering process of TiN conducted under a large plasma power. However, such a sputtering of TiN conducted under a large plasma power tends to require an increased $N_2$ content in the plasma gas mixture. Thus, when the $N_2$ content in the plasma gas mixture is excessive, the obtained TiN film tends to show a low density and a large electric resistance.

SUMMARY OF THE INVENTION

Accordingly, it is a general object of the present invention to provide a novel and useful fabrication process of a semiconductor device wherein the foregoing problems are eliminated.

Another and more specific object of the present invention is to provide a fabrication process of a semiconductor device including a reactive sputtering process of a TiN diffusion barrier wherein the condition for sputtering a TiN film suitable for a diffusion barrier is substantially expanded.

Another object of the present invention is to provide a method of fabricating a semiconductor device including a reactive sputtering process of a nitride film, said reactive sputtering process comprising the steps of:

(A) sputtering a first nitride film on a substrate by using a target of a refractory metal element under a first sputtering condition set such that a deposition of a nitride of said refractory metal element occurs on said substrate as a result of said sputtering; and (B) sputtering, after said step (A), a second nitride film on said first nitride film by using said target used in said step (A) under a second sputtering condition, wherein said second sputtering condition is set such that no deposition of said nitride occurs on said first nitride film.

Another object of the present invention is to provide a method of forming a nitride film by a reactive sputtering process, comprising the steps of:

(A) sputtering a first nitride film on a substrate by using a target of a refractory metal element under a first sputtering condition set such that a deposition of a nitride of said refractory metal element occurs on said substrate as a result of said sputtering; and (B) sputtering, after said step (A), a second nitride film on said first nitride film by using said target used in said step (A) under a second sputtering condition, wherein said second sputtering condition is set such that no deposition of said nitride occurs on said first nitride film.

Another object of the present invention is to provide a semiconductor device structure, comprising:

a substrate;

a first nitride film of a refractory metal element formed on said substrate; and a second nitride film of said refractory metal element formed on said first nitride film;

said second nitride film having an electrical resistance smaller than an electrical resistance of said first nitride film.

According to the present invention, it is possible to fabricate a semiconductor device carrying a dense and low resistance nitride film suitable for a diffusion barrier or a glue layer of a W layer by way of a reactive sputtering process of Ti.

Other objects and further features of the present invention will become apparent from the following description when read in conjunction with the attached drawings.

BRIEF DESCRIPTION OF THE DRAWINGS

FIG. 12 is a diagram showing a plasma power sequence used in the second embodiment of the present invention.

DETAILED DESCRIPTION OF THE PREFERRED EMBODIMENTS

[PRINCIPLE]

First, the principle of the present invention will be described with reference to FIGS. 1 and 2.

In the course of experimental investigation on a reactive sputtering process of a TiN film using a Ti target, the inventor of the present invention has discovered that the boundary of a region, defined in a plasma composition field represented in terms of a $N_2$ flowrate and an Ar flowrate, in which a deposition of a TiN film occurs, changes in the case in which a cleaned Ti target immediately after a cleaning process is used and in the case in which a Ti target used previously for sputtering a dummy TiN film on a dummy substrate is used. In the cleaning process, a dummy Ti film is sputtered on a dummy substrate.

Figure 1:
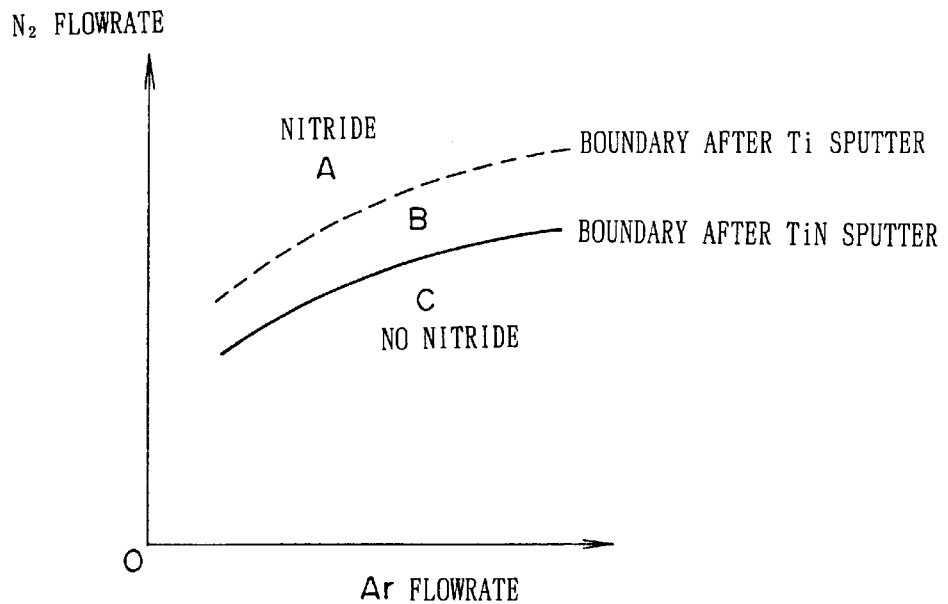
FIG. 1 is a diagram explaining the principle of the present invention.

Referring to FIG. 1, it will be noted that the deposition of TiN occurs only in a region A in which the $N_2$ flowrate, and hence the $N_2$ concentration in the plasma gas mixture supplied to a reaction chamber of a sputtering apparatus, is set large, as long as a cleaned Ti target is used. On the other hand, when a Ti target used previously for sputtering a TiN film is used for the target, it was discovered that the deposition of a TiN film occurs not only in the region A but also in a region B in which the $N_2$ concentration in the plasma gas mixture is lower. When the $N_2$ concentration in the plasma gas mixture is lowered further as indicated in a region C, no deposition of TiN occurs. In the region C, only a Ti film is deposited.

Thus, in the region B between the region A and the region C, both of the deposition of a Ti film and the deposition of a TiN film can occur depending upon the state of the Ti target used for the sputtering. In FIG. 1, it should be noted that the plasma power supplied to a reaction chamber of a sputtering apparatus for plasma excitation is held constant throughout.

The result of FIG. 1 further indicates that it is necessary to provide a high concentration nitrogen plasma atmosphere in the reaction chamber in order for the Ti atoms, sputtered from a freshly cleaned, pure Ti target, to form a deposition of a TiN film on the substrate. On the other hand, it is believed that a thin TiN film is already formed on the surface of a Ti target when the Ti target has been used previously for sputtering a TiN film. Thus, when such a Ti target carrying thereon a thin TiN film is used for the sputtering, it is not necessary to provide a high concentration nitrogen plasma atmosphere in the reaction chamber of the sputtering apparatus for depositing a TiN film.

Further, it should be noted that the activation energy for nitriding a Ti target would be reduced substantially when there is already a TiN film on the target surface. Thus, whenever the TiN film on the target surface is consumed with the progress of the sputtering, the exposed Ti surface is covered immediately by a new TiN film.

Figure 2:
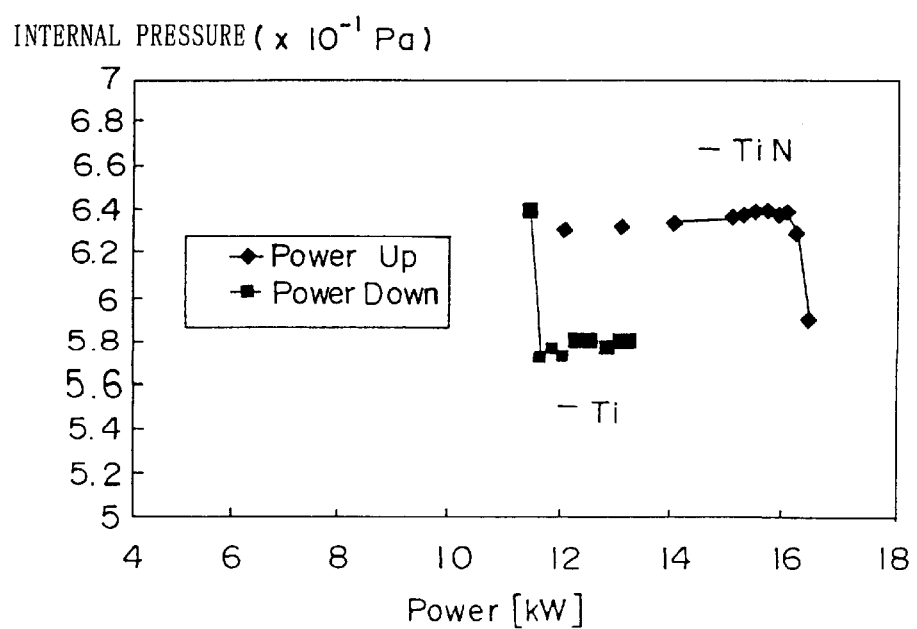
FIG. 2 is another diagram explaining the principle of the present invention.

FIG. 2 shows a boundary of the plasma composition between a region in which the deposition of TiN occurs and a region in which the deposition of Ti occurs, for the case in which the plasma power is changed, wherein solid circles indicate the boundary in which the deposited film changes from TiN to Ti when the plasma power is increased progressively, while the solid squares indicate the boundary in which the deposited film changes from Ti to TiN with a decrease of the plasma power. In FIG. 2, the deposition is made while setting the total pressure of the plasma gas in the reaction chamber to 0.6 Pa at the beginning of the experiment.

As will be seen from FIG. 2, the initial deposition of a TiN film changes to a deposition of a Ti film when the plasma power has exceeded a power of about 16 kW as the plasma power is increased gradually from a low power initial state. On the other hand, the initial deposition of a Ti film changes to the deposition of a TiN film when the plasma power has crossed a power of 11–12 kW as the plasma power is decreased gradually from a high power initial state. Thus, FIG. 2 indicates that there appears a hysteresis loop in which the plasma power necessary for depositing a TiN film by way of a reactive sputtering process changes when the plasma power is increased and when the plasma power is decreased. Such an existence of the hysteresis loop also supports the foregoing hypothesis that the deposition of TiN is facilitated when the plasma power is increased from the low power state to the high power state due to the TiN film covering the target surface and that the deposition of TiN is diminished when the plasma power is decreased from the high power state to the low power state due to the absence of the TiN film on the target surface.

Figure 3:
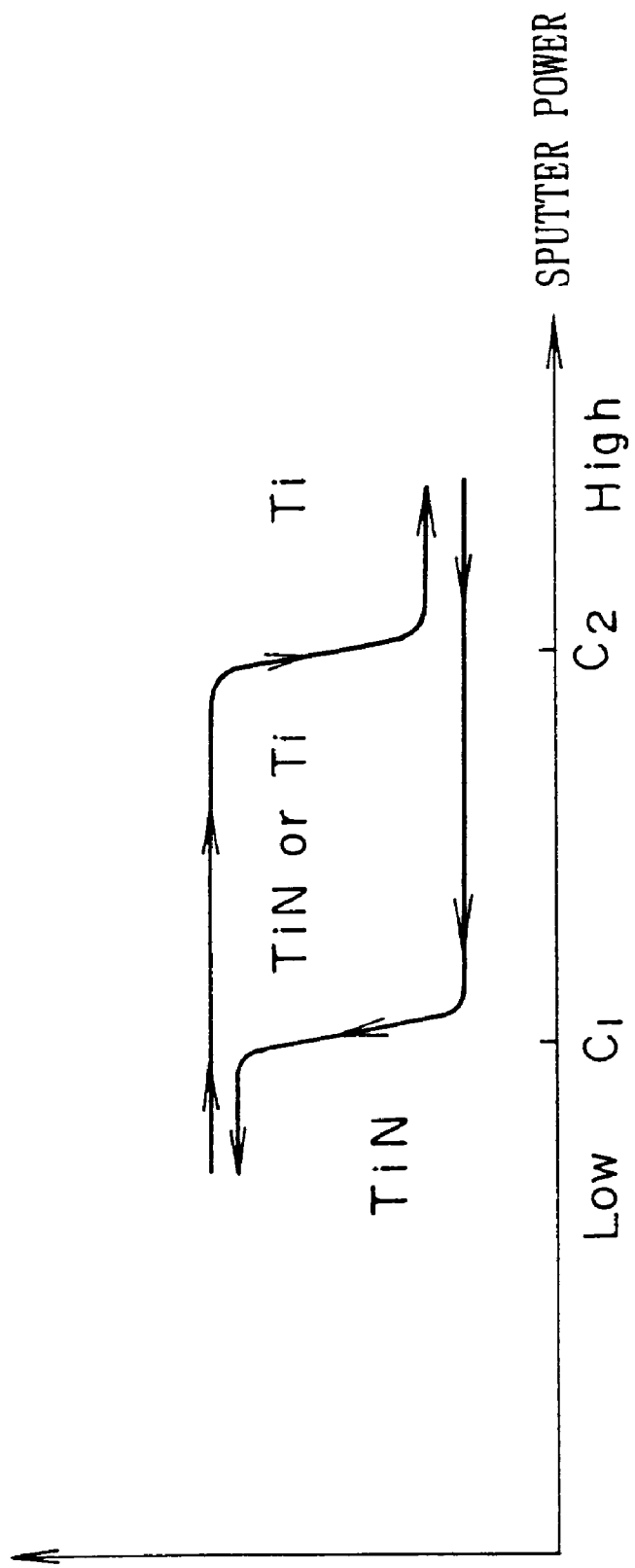
FIG. 3 is a diagram showing a hysteresis loop of FIG. 2 discovered by the inventor schematically.

FIG. 3 shows the hysteresis loop of FIG. 2 schematically. As will be understood from FIG. 2, the hysteresis loop is characterized by a fist critical point $C_1$ below which the hysteresis loop appears and a second critical point $C_2$ above which the hysteresis loop disappears. As will be understood from the experimental result of FIG. 2, the critical points $C_1$ and $C_2$ are observed very clearly. In the case of FIG. 2, the critical point $C_1$ is at about 11 kW while the critical point $C_2$ is at about 16 kW.

The existence of the hysteresis loop of FIG. 2 or FIG. 3 enables a deposition of a high density TiN film having a dense texture by conducting the reactive sputtering under a condition of low plasma gas pressure and high plasma power not possible conventionally. More specifically, an initial TiN film is deposited first with a low plasma power below the critical point $C_1$, followed by a deposition of a main TiN film conducted with a high plasma power above the critical point $C_1$ but below the critical point $C_2$.

Further, it is noted from FIG. 2 or FIG. 3 that the internal pressure of the reaction chamber increases when the deposition of a TiN film is started. While this phenomenon is not fully understood yet, it is believed that this pressure increase is caused as a result of difference in the sputtering rate between Ti and TiN. It should be noted that the sputtering rate of Ti is about four times as large as the sputtering rate of TiN.

Figure 4:
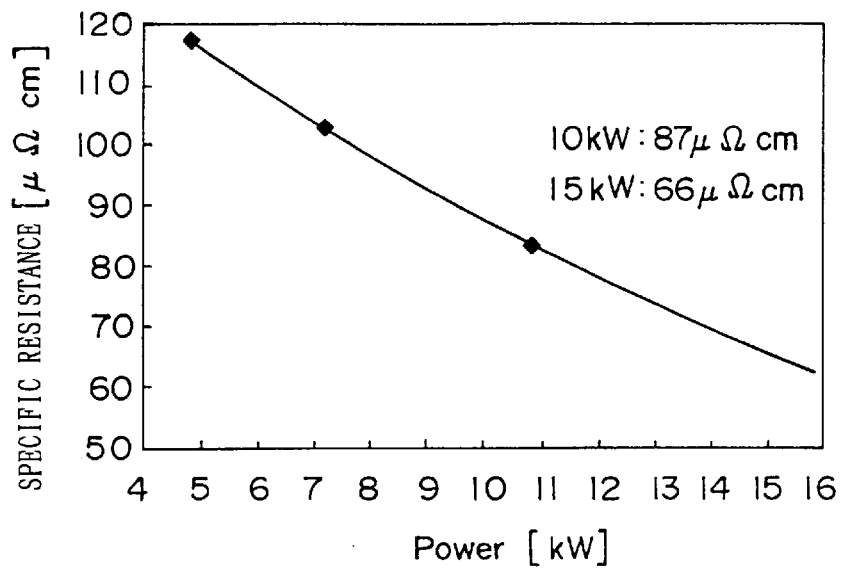
FIG. 4 is a diagram showing the relationship between a specific resistance and a plasma power for a TiN film obtained by a reactive sputtering process of the present invention.

FIG. 4 shows the relationship between the plasma power used for the reactive sputtering process and the specific resistance.

Referring to FIG. 4, it should be noted that the specific resistance of the obtained TiN film decreases with the plasma power applied during the sputtering process. In other words, it is preferable to supply a large plasma power as large possible for reducing the resistance of the deposited TiN barrier.

The present invention successfully achieves this goal by increasing the plasma power up to the critical point $C_2$ of about 16 kW, after the formation of the initial TiN film at a plasma power smaller than the critical point $C_1$. During this deposition of the initial TiN film, the freshly cleaned surface of the Ti target is covered by a TiN film as noted already. It should be noted that no TiN film would be obtained when the sputtering is carried out under such a large plasma power when a cleaned Ti target is used directly for the sputtering, as is practiced conventionally in the art. From the relationship of FIG. 4, it will be noted that the TiN film thus obtained has a specific resistance of about 85 $\Omega$cm or less in correspondence to the preferable plasma power of 11–12 kW or more.

Figure 5:
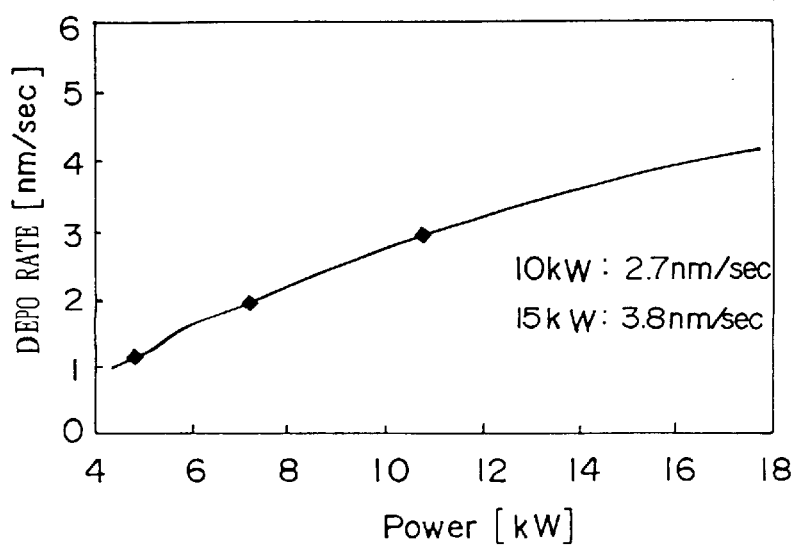
FIG. 5 is a diagram showing the relationship between the deposition rate and the plasma power used in the reactive sputtering process.

FIG. 5 shows the relationship between the deposition rate and the plasma power during the reactive sputtering process of TiN.

Referring to FIG. 5, it will be noted that the deposition rate of the TiN film increases with the plasma power. This means that the throughput of a semiconductor fabrication process increases by increasing the plasma power during the reactive sputtering process.

Figure 6:
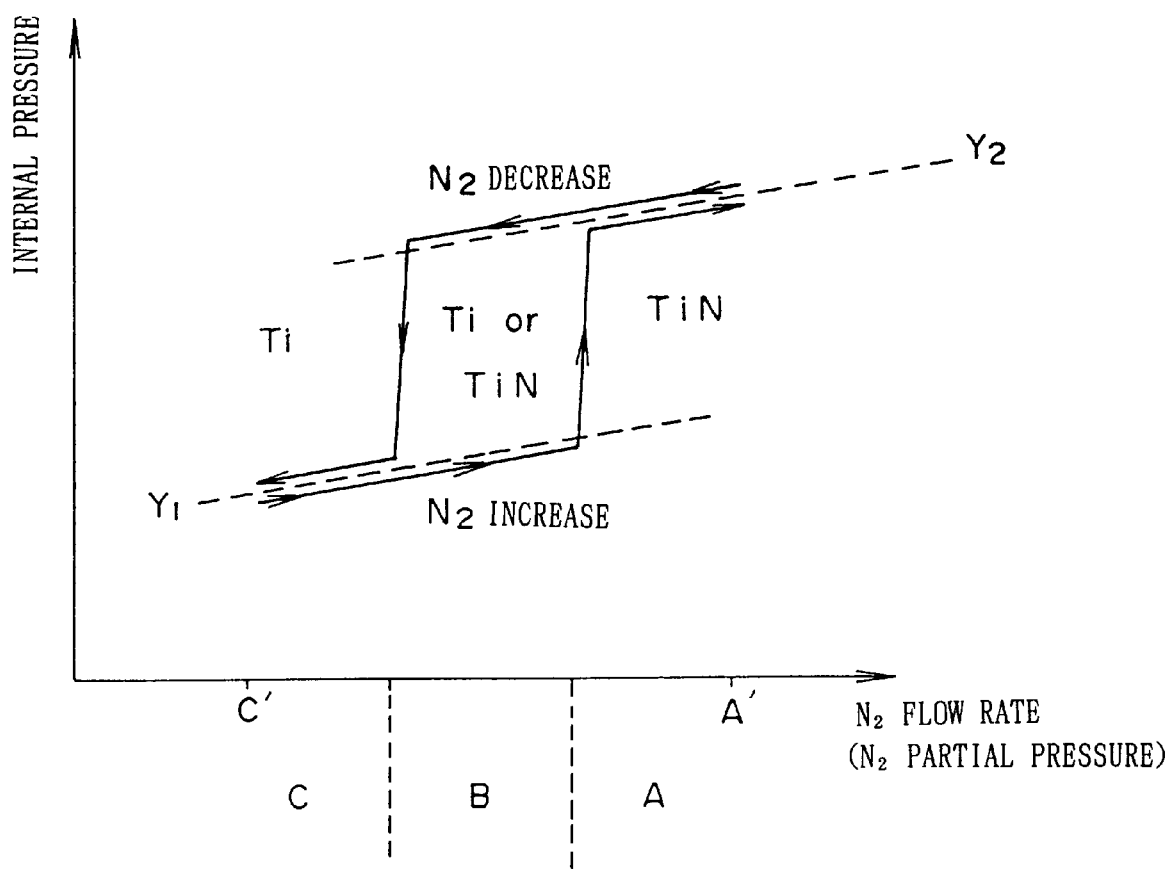
FIG. 6 is a diagram showing a hysteresis loop observed in the reactive sputtering process of TiN when a $N_2$ flowrate is changed.

Further, FIG. 6 shows a hysteresis loop observed for the case in which the plasma power is held constant and the $N_2$ flowrate is changed.

Referring to FIG. 6, it will be noted that the boundary between the region in which a deposition of Ti occurs and the region in which a deposition of TiN occurs is given by a line $Y_1$, when the $N_2$ flowrate is increased gradually from the region C to region B of FIG. 1. When the $N_2$ flowrate is increased further to the region A, on the other hand, the deposition of TiN starts. With the onset of the deposition of TiN, the internal pressure of the reaction chamber starts to increase.

In the region A, it should be noted that the boundary between the region in which a deposition of Ti occurs and the region in which a deposition of TiN occurs is given by a line $Y_2$. Thus, when $N_2$ flowrate is decreased gradually from the region A to the region B, the boundary between the region in which a deposition of Ti occurs and the region in which a deposition of TiN occurs, is now given by the line $Y_2$. When the $N_2$ flowrate is decreased further to the region C, the boundary between the region in which a deposition of Ti occurs and the region in which a deposition of TiN occurs returns to the foregoing line $Y_1$.

[FIRST EMBODIMENT]

Hereinafter, a fabrication process of a semiconductor device according to a first embodiment of the present invention will be described with reference to FIGS. 7A–7D.

Figure 7A:
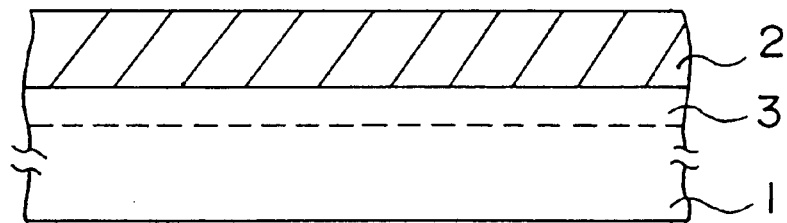
FIGS. 7A–7D are diagrams showing the fabrication process of a semiconductor device according to a first embodiment of the present invention.

Referring to FIG. 7A, an insulation film 2, which may be any of $SiO_2$, a phosphosilicate glass (PSG) or a borophosphosilicate glass (BPSG), is deposited on a Si substrate 1 for example by a CVD process. It should be noted that the Si substrate 1 includes a region 3 in which a semiconductor device such as a MOS transistor (not shown) is formed. For example, the region 3 may be any of a source region or a drain region of such a MOS transistor.

Figure 7B:
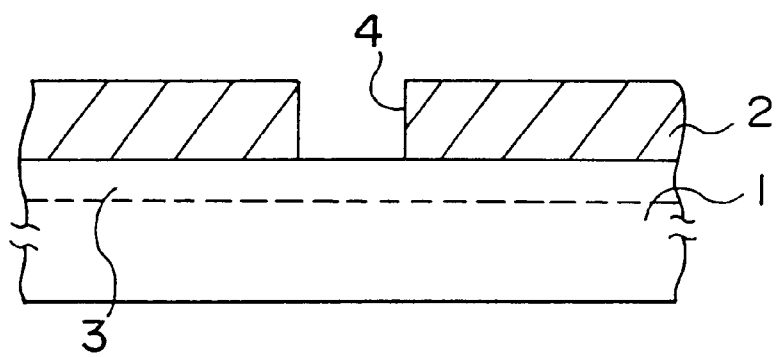
Figure 7C:
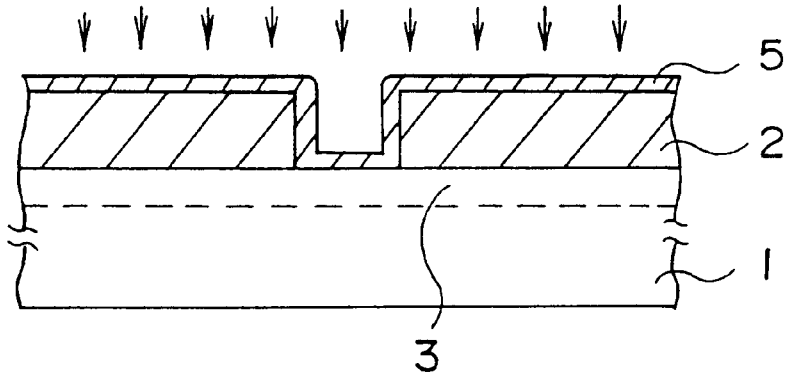

Next, in the step of FIG. 7B, a contact hole 4 is formed in the insulation film 2 so as to expose a part of the region 3 of the substrate 1, and a step of FIG. 7C is conducted in which a diffusion barrier 5 of TiN is deposited by a reactive sputtering process conducted in a plasma of a gas mixture of $N_2$ and Ar while using a Ti target, with a thickness of 10–20 nm.

In the step of FIG. 7C, it should be noted that the sputtering process of the diffusion barrier 5 is conducted in two steps, the first step to form a first TiN film with a first plasma power set such that a deposition of the TiN film occurs on the substrate 1 even when a pure, freshly cleaned Ti target is used for the sputtering, followed by a second step to form a second TiN film on the first TiN film while using the same Ti target, wherein the second step is conducted with a second plasma power set such that a deposition of TiN would not occur when a cleaned Ti target is used.

Figure 8:
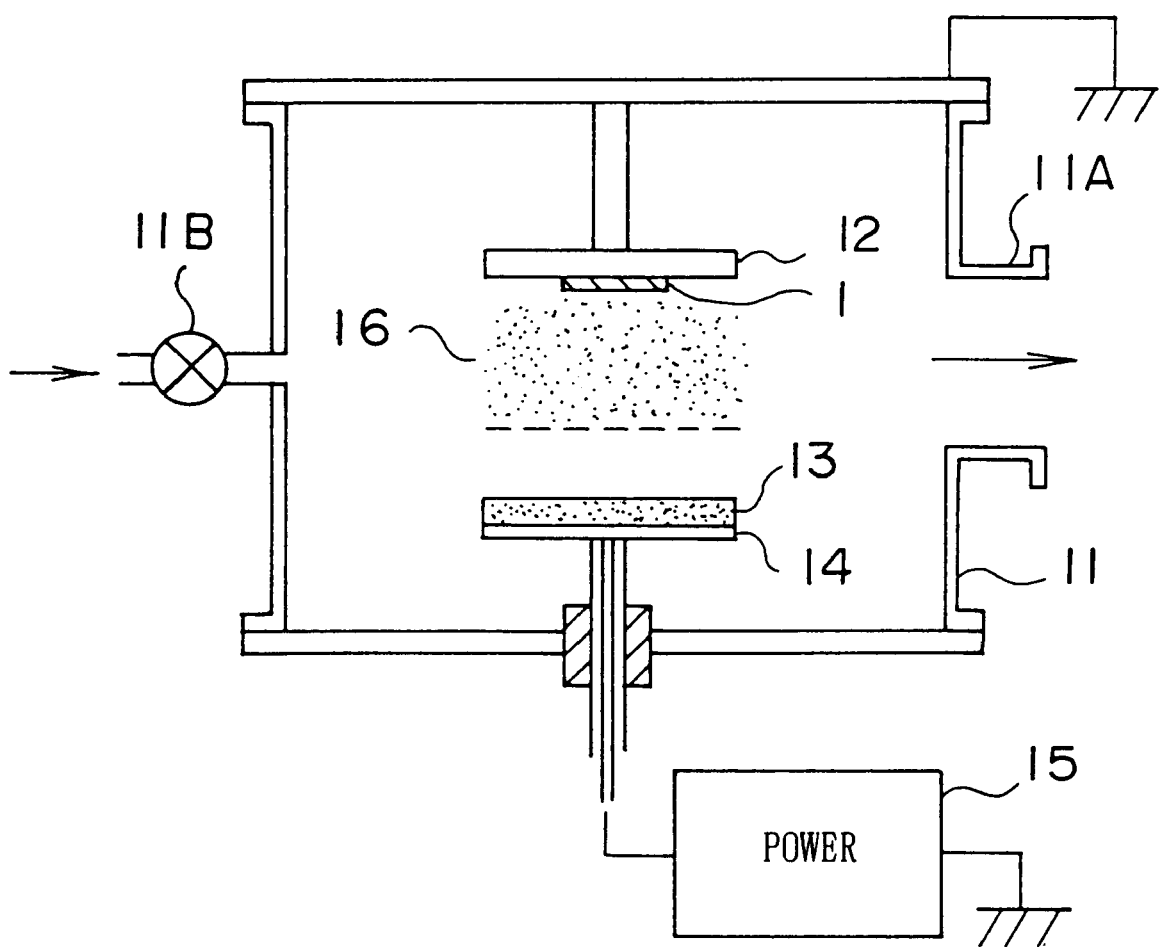
FIG. 8 is a diagram showing the construction of a sputtering apparatus used in the present invention.

FIG. 8 shows the construction of a sputtering apparatus 10 used for carrying out the process of FIG. 7C.

Referring to FIG. 8, the sputtering apparatus 10 includes a grounded reaction chamber 11 in which an anode 12 and a cathode 14 are provided with a mutually facing relationship, wherein the anode 12 supports thereon the substrate 1, while the cathode 14 carries thereon a Ti target 13. The reaction chamber 11 is evacuated at an evacuation port 11A to a high degree of vacuum, and a mixture of Ar and $N_2$ is introduced into the reaction chamber 11 via a valve 11B. By supplying a DC and/or RF power to the cathode 14 from a power source 15, a plasma 16 is established between the anode 12 and the cathode 14, and the Ti atoms sputtered from the Ti target 13 are deposited on the substrate 1 on the anode 12 in the form of TiN after reacting with N atoms in the plasma.

Figure 9:
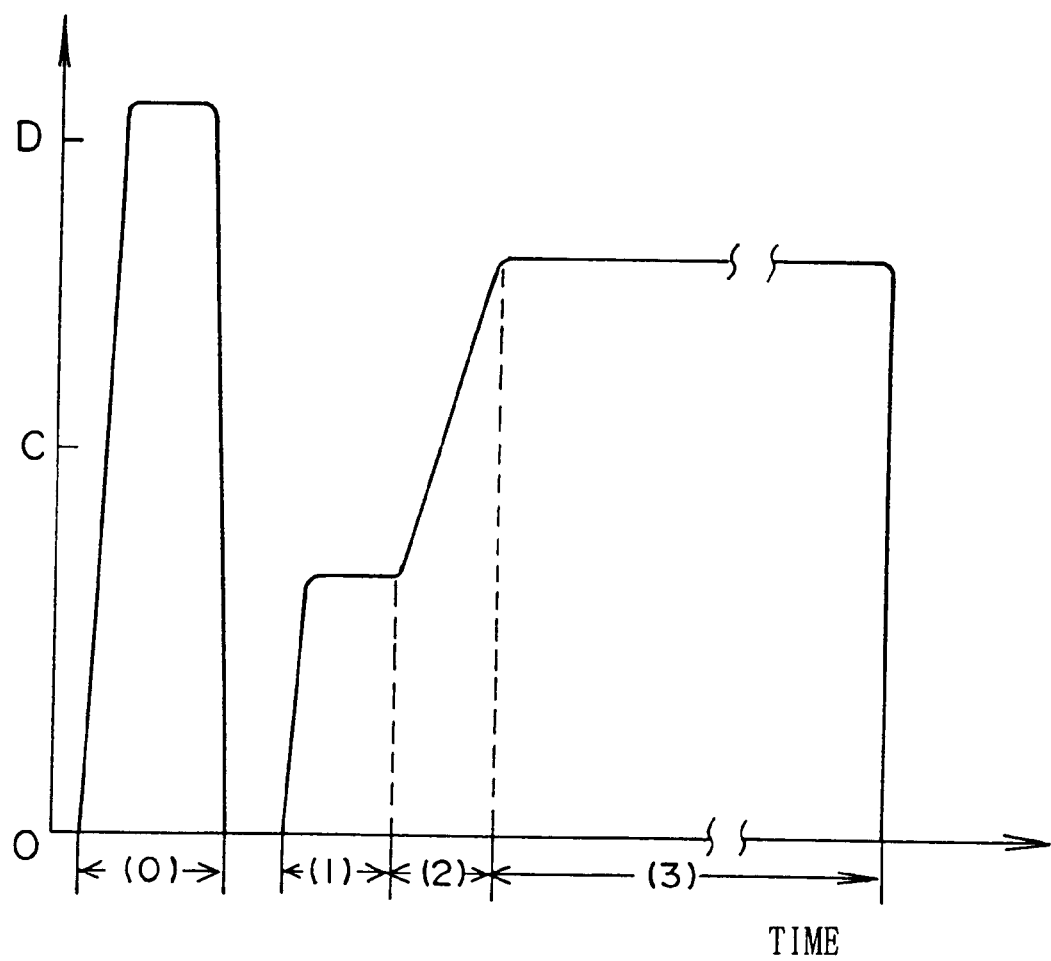
FIG. 9 is a diagram showing a plasma power sequence used in the first embodiment of the present invention.

FIG. 9 shows the change of the plasma power in the reactive sputtering process of FIG. 7C.

Referring to FIG. 9. a preparatory step (0) is carried out first, in which the surface of the Ti target 13 is cleaned by sputtering a Ti film on a dummy substrate in a plasma of an inert gas such as an Ar plasma. In the preparatory step (0), the plasma power may be set to be equal to or larger than the foregoing critical value $C_2$. When the sputtering is made in an inert gas plasma, however, it is also possible to set the plasma power to be somewhere between the critical values $C_1$ and $C_2$ or below the critical value $C_1$.

Next, in a step (1) of FIG. 9, the plasma power is set below the critical power $C_1$ of FIG. 3, and the sputtering of TiN is conducted on the substrate 1 while setting the composition or pressure of the plasma gas to a range in which the hysteresis of FIG. 2 or FIG. 3 appears. For example, the pressure of the plasma gas in the reaction chamber 11 may be set to 0.58–0.63 Pa. In the step (1), the plasma power is set to be 11 kW or lower in view of the relationship of FIG. 2. As a result of the sputtering, a TiN film is deposited on the substrate 1 as the lowermost layer of the diffusion barrier 5. At the same time, a TiN film is formed on the surface of the Ti target 13.

It should be noted that the foregoing step (1) is continued for 5–30 seconds, and the process proceeds further to a step (3), by changing the plasma power from the first power to a second power larger than the first power but not exceeding the critical value $C_2$ of FIG. 3, while continuing the sputtering in an intervening, transitional step (2). The sputtering of the TiN film of the step (3) is continued as necessary. As a result of the sputtering in the step (3), the diffusion barrier 5 grows to a thickness of 10–20 nm.

Figure 7D:
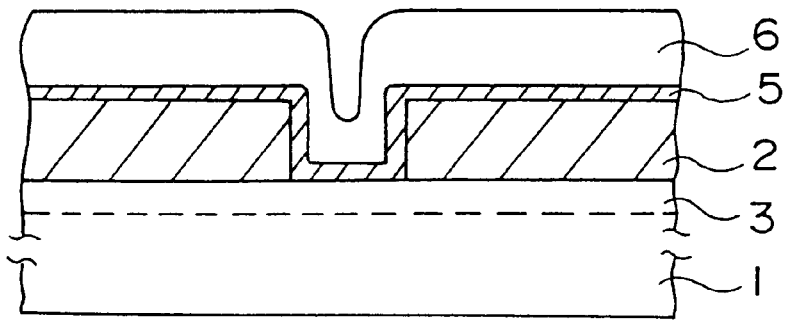

Next, a conductor layer 6 of Al or an Al-alloy is deposited in the step of FIG. 7D on the structure of FIG. 7C such that the conductor layer 6 contacts with the diffusion region 3 at the foregoing contact hole 4.

In the process of the present embodiment described above, it is possible to carry out the reactive sputtering of TiN repeatedly with a low $N_2$ concentration in the plasma gas mixture and a high plasma power, once a sputtering of TiN is made in the step (1) and as long as there is no intervening cleaning process of the Ti target.

Figure 10:
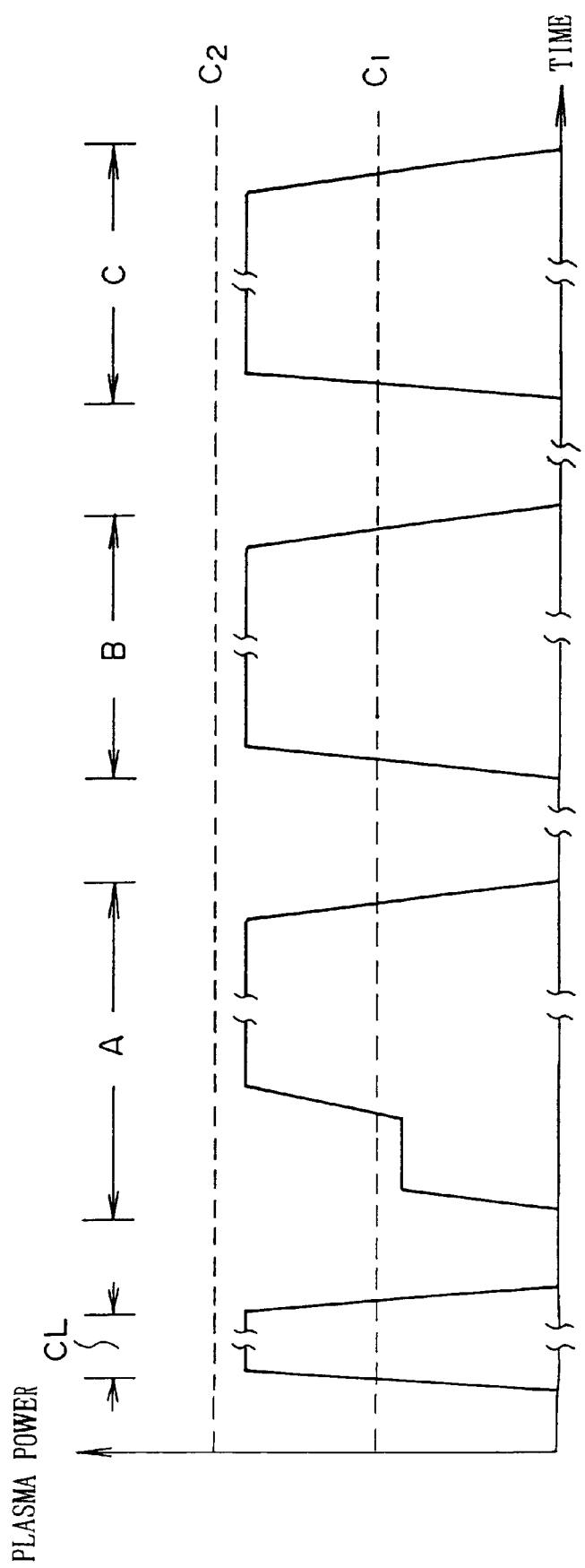
FIG. 10 is a diagram showing a modification of FIG. 9.

FIG. 10 shows a modification of the reactive sputtering process of TiN of the present embodiment.

Referring to FIG. 10, it will be noted that a cleaning sequence CL is carried out at first for cleaning the Ti target similarly to the step (0) of FIG. 9, followed by a first plasma sequence A which includes steps substantially identical with the steps (1)–(3) of FIG. 9. In the illustrated case of FIG. 10, too, the cleaning sequence CL is carried out in an Ar plasma atmosphere, and the plasma power is set between the critical values $C_1$ and $C_2$ during the cleaning process. However, it is possible to set the plasma power above the foregoing critical value $C_2$ or below the critical value $C_1$, similarly to the cleaning step (0) of FIG. 9.

In a second plasma sequence B, the plasma power is set to the second plasma power from the beginning, and the deposition of the TiN film is carried out in a single step. Further, a similar plasma sequence C may be repeated as necessary.

[SECOND EMBODIMENT]

Next, a second embodiment of the present invention will be described with reference to FIGS. 11A–11E, wherein those parts described previously are designated by the same reference numerals and the description thereof will be omitted.

Figure 11A:
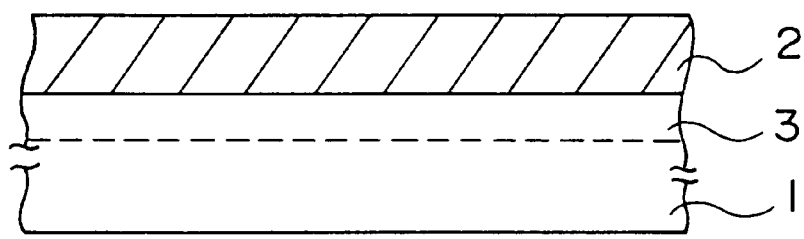
FIGS. 11A–11E are diagrams showing the fabrication process of a semiconductor device according to a second embodiment of the present invention.

Referring to FIG. 11A, the step is substantially identical with the step of FIG. 7A, and thus, a structure substantially identical to the structure of FIG. 7A is obtained in the step of FIG. 11A. Further, the step of FIG. 11B is substantially identical with the step of FIG. 7B, and thus, a structure substantially identical to the structure of FIG. 7B is obtained in the step of FIG. 11B.

Figure 11B:
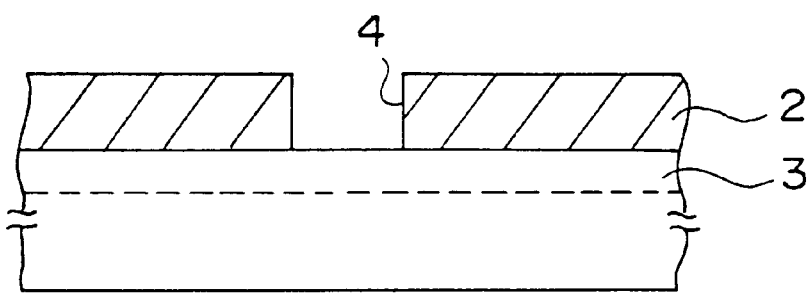
Figure 11C:
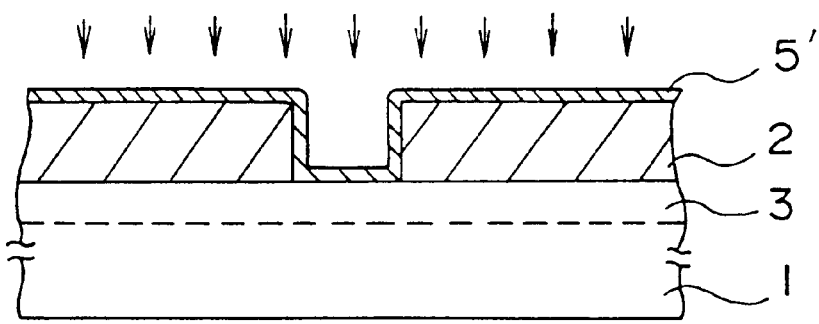

Next, in the step of FIG. 11C, a Ti film is deposited on the structure of FIG. 11B by using a sputtering apparatus of FIG. 8 as an adhesion layer 5' such that the adhesion layer 5' covers the exposed surface of the diffusion region 3 as well as the inner wall of the contact hole 4. Further, the diffusion barrier 5 is formed in the following step of FIG. 11D on the adhesion layer 5' thus deposited in the step of FIG. 11C.

Figure 11D:
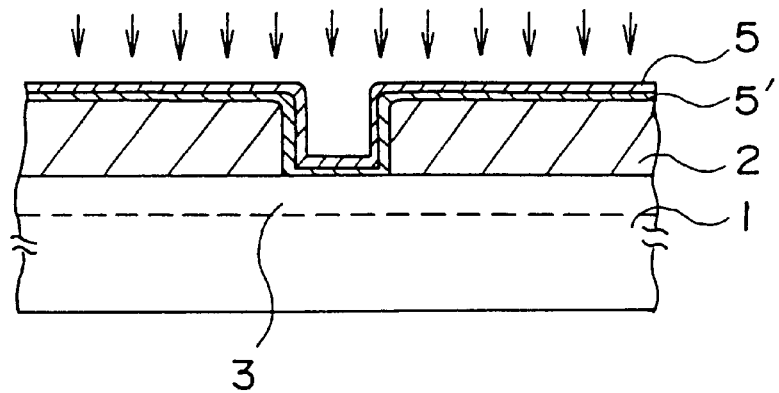

FIG. 12 shows the plasma power sequence used in the deposition of the diffusion barrier 5 in the steps of FIGS. 11C and 11D.

Referring to FIG. 12, a step X is carried out after a cleaning step of the Ti target corresponding to the step CL of FIG. 10, in which a deposition of the Ti layer 5' is carried out by setting the internal pressure of the reaction chamber 11 to 0.6 Pa such that the foregoing hysteresis loop appears and further by setting the plasma power to a third plasma power exceeding the foregoing critical value $C_2$. The third plasma power is thereby set such that a deposition of Ti occurs irrespective of the existence of the hysteresis loop. It is also possible to set the plasma power to the foregoing third plasma power during the cleaning process of the Ti target 13.

In the plasma sequence of FIG. 12, the plasma is interrupted once after the step X is completed. Thereafter, the plasma power is increased again, and a plasma sequence corresponding to the plasma sequence A of FIG. 10 is carried out as indicated in FIG. 12. By carrying out the step (1) in the sequence A with a low plasma power, it is possible to cover the surface of the Ti target with TiN even when the sequence A is carried out after the step X for depositing a Ti film. After this, it is possible to form the diffusion barrier 5 by a dense TiN film even when the plasma power is increased.

Figure 11E:
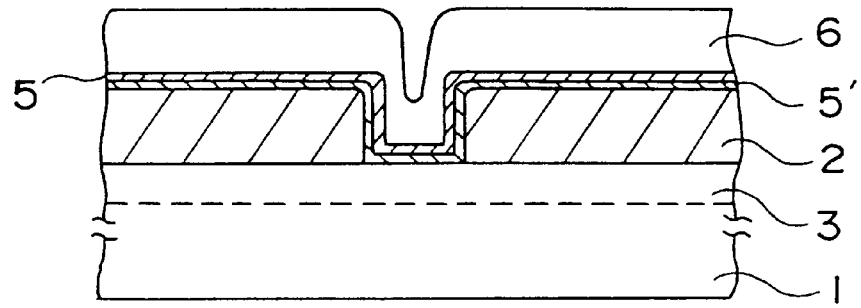

After the step of FIG. 11D, a step of FIG. 11E is conducted, in which an Al layer or an Al-alloy layer is deposited on the structure of FIG. 12D as the conductor layer 6. By patterning the conductor layer 6, it is possible to form an interconnection pattern having a low resistance and high density. The interconnection pattern thus obtained further has an advantageous feature of excellent surface morphology due to the excellent flatness of the conductor layer

[THIRD EMBODIMENT]

Next, a third embodiment of the present invention will be described with reference to FIG. 13.

In the present embodiment, the step of FIG. 7C is conducted such that the $N_2$ flowrate, or the $N_2$ partial pressure in the reaction chamber 11 of FIG. 8, is increased first, to cause a deposition of TiN by setting the sputtering condition to the region A of FIG. 1. After the initial deposition of TiN, the $N_2$ flowrate, and hence the $N_2$ partial pressure, is decreased such that the deposition of TiN is continued in the region B of FIG. 1. In this case, the initial TiN film may have a lower density and a higher electrical resistance than the main TiN film deposited thereon. However, the main TiN film, which is deposited on the initial TiN film under the condition of the region B, has a high density and low electrical resistance suitable for a diffusion barrier and a glue layer of W due to the low $N_2$ concentration of the plasma gas mixture used for the sputtering.

Figure 13:
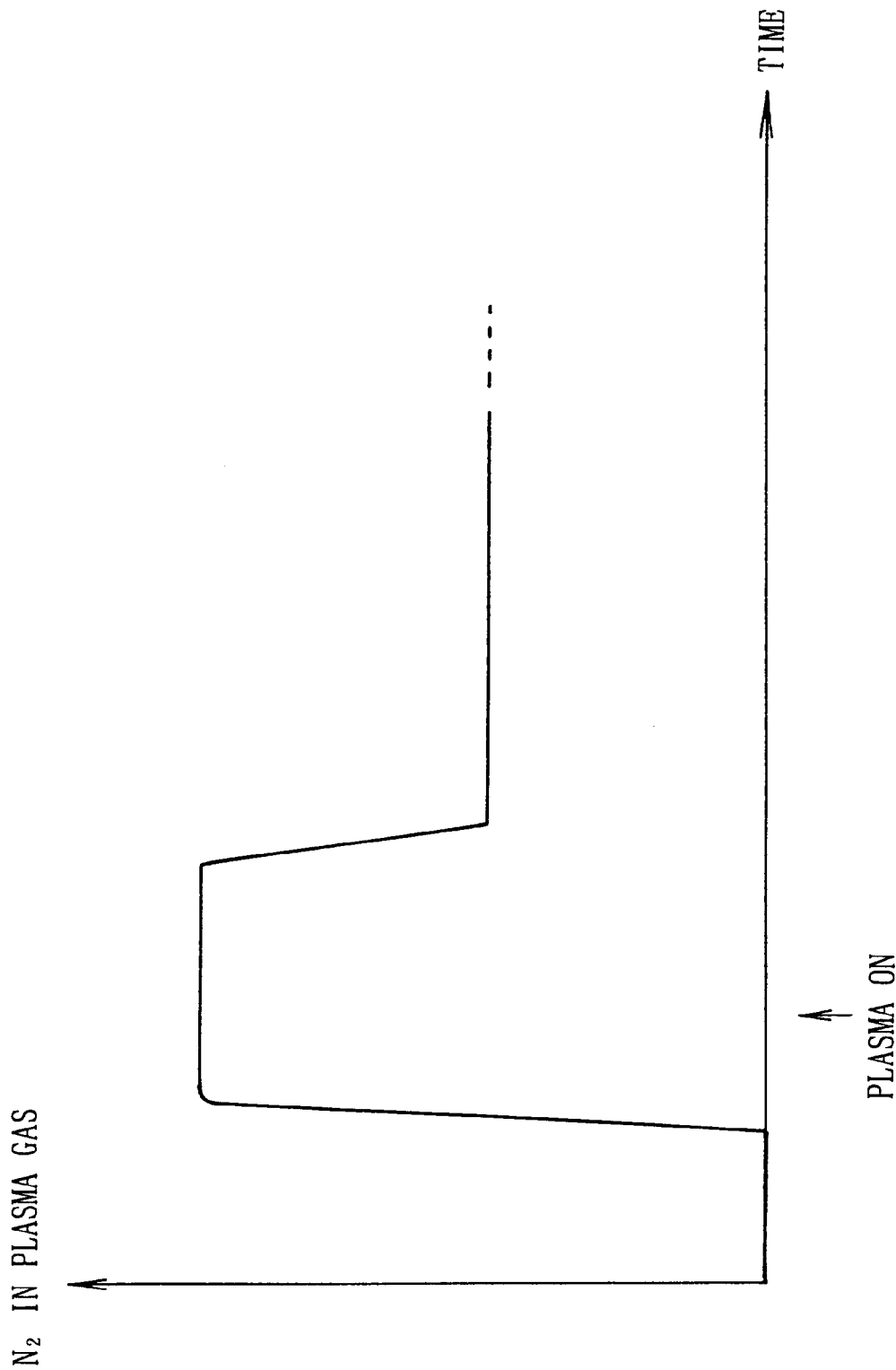
FIG. 13 is a diagram showing a plasma power sequence used in a third embodiment of the present invention.

FIG. 13 shows an example of the $N_2$ partial pressure control of the plasma gas according to the third embodiment of the present invention, which makes use of the hysteresis loop of FIG. 6.

Referring to FIG. 13, the $N_2$ flowrate is increased first to the region A of FIG. 6 prior to the application of a plasma power. For example, $N_2$ flowrate is increased such that the $N_2$ partial pressure in the reaction chamber 11 is about 0.64 Pa or more at the onset of the deposition. As will be understood from the relationship of FIG. 6, a deposition of Ti, not TiN, occurs when a cleaned Ti target is used and the $N_2$ concentration in the plasma gas mixture is decreased below this limit.

After setting the $N_2$ partial pressure of the reaction chamber as such, a plasma power is supplied to the reaction chamber 11, and the deposition of the initial TiN film is achieved.

Once the initial TiN film is thus deposited, the $N_2$ concentration in the plasma is reduced as low as possible within a constraint that the $N_2$ partial pressure in the reaction chamber 11 does not decrease below about 0.58 Pa. Thereby, a high density, low resistance TiN film is deposited on the initial TiN film as the main TiN film. In order to maximize the density and minimize the resistance of the main TiN film, it is desired to increase the plasma power as much as possible within the range in which the hysteresis loop of FIG. 6 appears, in view of the relationship of FIG. 4 and FIG. 5. In other words, it is desired to set the plasma power close to the critical point $C_2$.

It should be noted that the present invention is by no means limited to a reactive sputtering of a TiN film conducted by using a Ti target. For example, the present invention is applicable also for depositing a nitride film of a refractory metal element such as W, Ta, Co, Hf, and the like, by using a target of such a refractory metal.

Further, the present invention is not limited to the embodiments described heretofore, but various variations and modifications may be made without departing from the scope of the invention.

What is claimed is:

1. A semiconductor device structure, comprising:

a substrate;

a first nitride film of a refractory metal element formed on said substrate; and a second nitride film of said refractory metal element formed on said first nitride film;

said second nitride film having an electrical resistance smaller than an electrical resistance of said first nitride film, wherein said first nitride film has a specific resistance of 85 Ωcm or more, and wherein said second nitride film has a specific resistance of less than 85 Ωcm.

2. A semiconductor device as claimed in claim 1, wherein said first nitride film contacts with a diffusion region formed on said substrate, and wherein said first and second nitride films form a diffusion barrier structure.

* * * * *